(12) United States Patent
Xu

(10) Patent No.: US 8,704,280 B2
(45) Date of Patent: Apr. 22, 2014

(54) SEMICONDUCTOR DEVICE WITH STRAINED CHANNELS INDUCED BY HIGH-K CAPPING METAL LAYERS

(75) Inventor: Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 13/240,782

(22) Filed: Sep. 22, 2011

(65) Prior Publication Data

US 2013/0075826 A1 Mar. 28, 2013

(51) Int. Cl.
*H01L 29/66* (2006.01)

(52) U.S. Cl.
USPC .......................................... 257/260

(58) Field of Classification Search
USPC ................. 257/410, 411, 412, 388, 387, 369; 438/157, 176, 199, 582, 902
See application file for complete search history.

(56) References Cited

U.S. PATENT DOCUMENTS

| | | | |
|---|---|---|---|
| 7,547,951 B2 * | 6/2009 | Lim et al. | 257/410 |
| 2006/0278934 A1 * | 12/2006 | Nagahama | 257/369 |
| 2008/0258227 A1 * | 10/2008 | Wang et al. | 257/369 |
| 2008/0293195 A1 * | 11/2008 | Krivokapic | 438/199 |
| 2009/0174003 A1 * | 7/2009 | Chang et al. | 257/369 |
| 2010/0109098 A1 * | 5/2010 | Lin et al. | 257/411 |
| 2010/0159684 A1 * | 6/2010 | Chang et al. | 438/585 |

* cited by examiner

*Primary Examiner* — Steven Loke
*Assistant Examiner* — Mouloucoulaye Inoussa
(74) *Attorney, Agent, or Firm* — Haynes and Boone, LLP

(57) ABSTRACT

A semiconductor device with a metal gate is disclosed. The device includes a semiconductor substrate including a plurality of source and drain features to form a p-channel and an n-channel. The device also includes a gate stack over the semiconductor substrate and disposed between the source and drain features. The gate stack includes a high-k (HK) dielectric layer formed over the semiconductor substrate. A tensile stress HK capping layer is formed on top of the HK dielectric layer in close proximity to the p-channel, and a compressive stress HK N-work function (N-WF) metal layer is formed on top of the HK dielectric layer in close proximity to the n-channel. A stack of metal gate layers is deposited over the capping layers.

4 Claims, 7 Drawing Sheets

US 8,704,280 B2

SEMICONDUCTOR DEVICE WITH STRAINED CHANNELS INDUCED BY HIGH-K CAPPING METAL LAYERS

BACKGROUND

When a semiconductor device such as a metal-oxide-semiconductor field-effect transistor (MOSFET) is scaled down through various technology nodes, several strategies have been employed to improve device performance. One strategy is to use a high-k (HK) dielectric material and metal gate (MG) transistor. Another strategy is to use a strained substrate technology. For example, by implementing a strained substrate technology, better device performance is often achieved by modulating strain in a transistor channel, which enhances mobility (e.g., electron or hole mobility) and thereby conductivity through the channel. As an example, an epitaxy silicon germanium (SiGe), or silicon carbide (SiC) layer, is formed in source and drain regions in p-type FET devices, or n-type FET respectively. However, current techniques to form these strained structures have not been satisfactory in all respects. For example, these strained structures may not produce sufficient stress in a channel region to improve device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

One of the broader forms of the present disclosure involves a semiconductor device with a metal gate. An exemplary semiconductor device includes a semiconductor substrate, a HK dielectric layer formed over the semiconductor substrate, a tensile stress type HK capping layer formed in closer proximity to a p-channel in a PMOS, a compressive stress N-WF metal layer formed on top of the HK layer in closer proximity to an n-channel in an NMOS, and a stack of metals gate layers deposited over the N-WF metal layer.

Another one of the broader forms of an embodiment of the present disclosure involves a semiconductor device with a metal gate that includes a semiconductor substrate, an interfacial layer formed over the semiconductor substrate, a HK dielectric layer formed over the semiconductor substrate, a tensile stress HK capping layer formed over the HK dielectric layer in a PMOS, a compressive stress HK capping layer formed over the HK dielectric layer in an NMOS, wherein the HK capping layer in the PMOS and the NMOS have different stress type, and further wherein p-channel and n-channel have different strain types.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
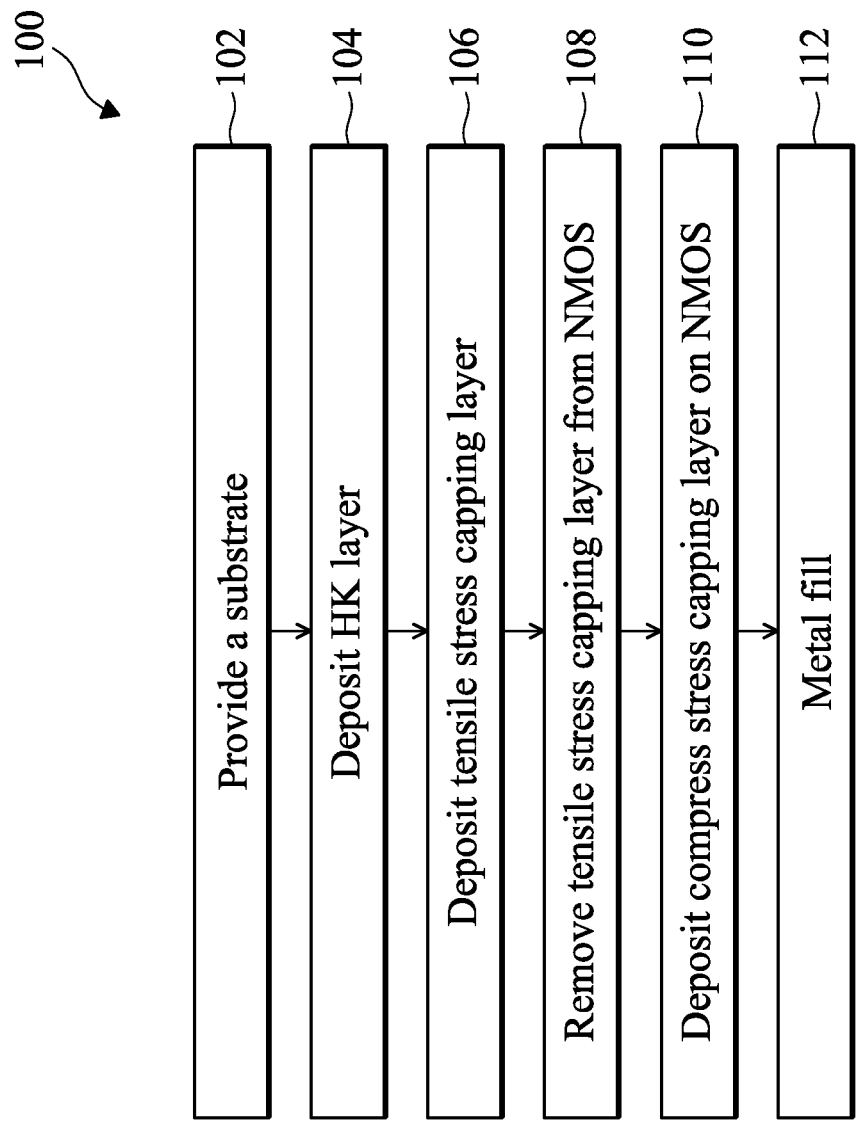
FIG. 1 is a flowchart of an example method for making a semiconductor device having a gate last HK/metal gate (MG) scheme constructed according to various aspects of the present disclosure.

FIG. 1 is a flowchart of one example embodiment of a method 100 for making a semiconductor device having a gate last HK/MG scheme constructed according to various aspects of the present disclosure. The method 100 is described with reference to FIGS. 2 through 7. In the gate last (or replacement gate) scheme, a dummy (sacrificial) poly gate structure is initially formed and followed by a normal CMOS process flow until deposition of an inter-layer dielectric (ILD). The dummy poly gate structure may then be removed and replaced with a metal gate structure. Thus, the gate is formed after high temperature processes have been applied in formations of, such as source and drain regions. The gate last (or replacement gate) process scheme avoids the problems of work function material stability due to high temperature processes.

The method 100 begins at step 102 by providing a semiconductor substrate 210. In the present embodiment, the substrate 210 includes silicon. Alternatively, the substrate may include germanium, silicon germanium or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

Figure 2:
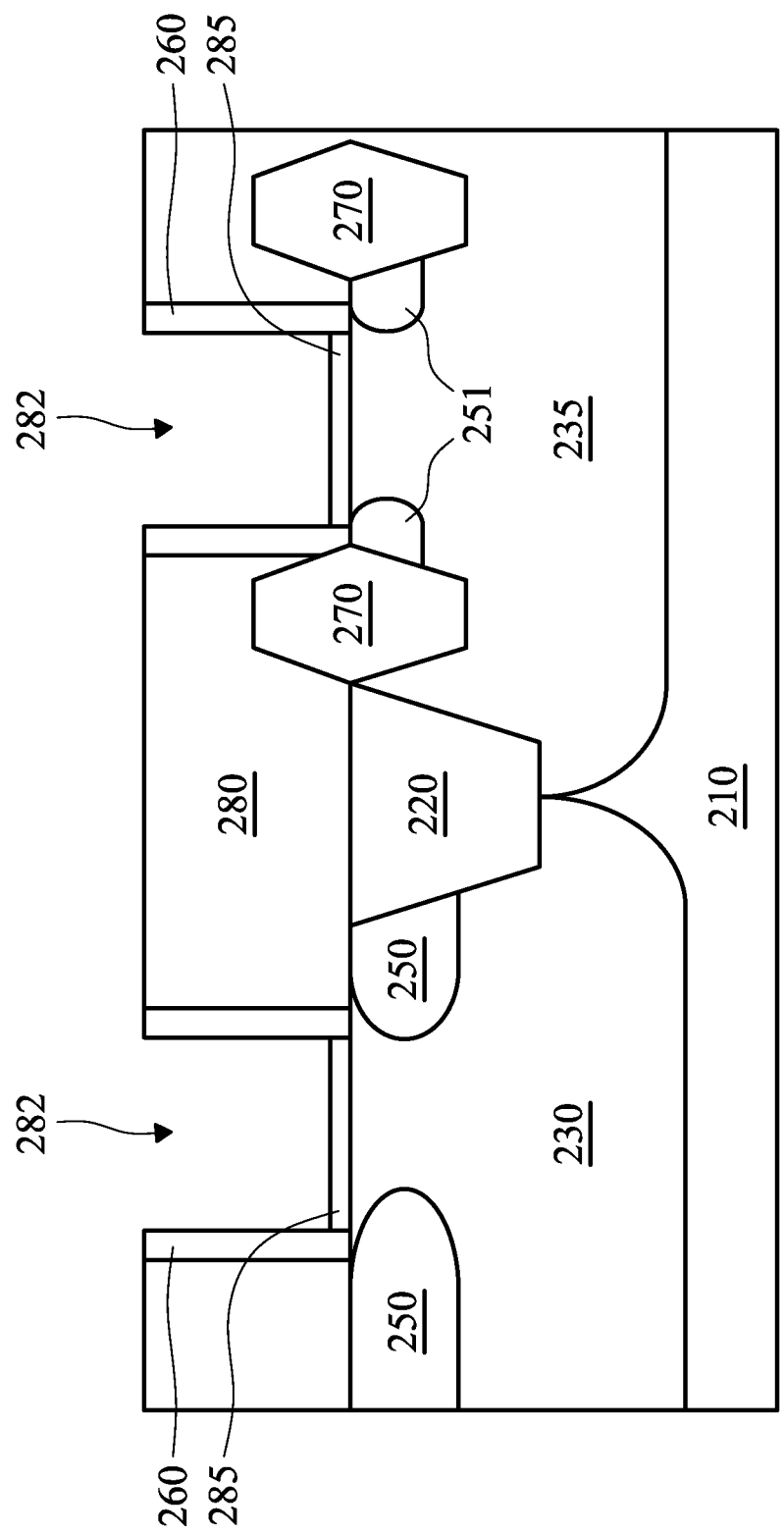
FIGS. 2 to 7 are cross-sectional views of an example embodiment of a semiconductor device having the gate last HK/metal gate scheme at fabrication stages constructed according to various aspects of the present disclosure.

In FIG. 2, the substrate 210 also includes various isolation features and the isolation features may include different structures formed using different processing technologies. For example, an isolation feature may include a shallow trench isolation (STI) feature 220. The formation of STI may include etching a trench (not shown) in the substrate 210 and filling the trench with insulator materials such as silicon oxide, silicon nitride, or silicon oxynitride. The filled trench may have a multi-layer structure such as a thermal oxide liner layer with silicon nitride filling the trench. As an example, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to polish back excessive oxide.

Continuing with FIG. 2, various doped regions such as a P-well 230, a N-well 235, are formed by implantation techniques. A portion of the substrate 210 is doped P-type and formed the P-well 230 where a n-channel device will be fabricated. Similarly, a portion of the substrate 210 is doped N-type and formed the N-well 235 where a p-channel device will be fabricated. The doped regions are doped with P-type dopants, such as boron or BF2, and/or N-type dopants, such as phosphorus or arsenic. The doped regions may be formed directly on the substrate 210, in a P-well structure, in an N-well structure, in a dual-well structure, or using a raised structure.

An interfacial layer (IL), such as SiO2, is disposed over the substrate 210 by ozone oxidation, CVD, ALD or any appropriate method. Thereafter, a gate material, such as polysilicon, is disposed over the IL layer by deposition techniques. For example, silane (SiH4), di-silane (Si2H6), or di-clorsilane (SiCl 2H4) may be used as a chemical gas in a CVD process to form the poly layer. Alternatively, an amorphous silicon layer may optionally be formed instead of the polysilicon layer. The poly layer may be referred to as a dummy poly layer since it will be replaced with a metal gate electrode as will be described later. The IL and the dummy gate layer are patterned to form a dummy gate stack (not shown).

Continuing with FIG. 2, source and drain regions, 250 and 251 are formed by a proper technique, such as one or more ion implantations. The source and drain regions, 250 may further include lightly doped source/drain (LDD) regions substantially aligned with the dummy gate stack and heavily doped source and drain (S/D) regions, 250 and 251, substantially aligned with associated sidewall spacers 260, which will be describe below.

Continuing with FIG. 2, sidewall spacers 260 are formed on the sidewalls of the dummy gate structures. The sidewall spacers 260 may include a dielectric material such as silicon oxide. Alternatively, the sidewall spacers 260 may optionally include silicon nitride, silicon carbide, silicon oxynitride, or combinations thereof. Gate spacers 260 are formed by dielectric deposition and dry etching process. After spacer 260 is formed, an epitaxial growth process is used to create regions 270. For instance, an etch process may be used to recess the substrate 210, and the epitaxial growth processes may be used to grow regions 270. Regions 270 are in the PFET device and may include SiGe. However, other suitable materials may be used by different embodiments.

After the formation of the source and drain (S/D) regions, 250 and 251, one or more annealing processes may be performed to activate the S/D regions. The annealing processes comprise rapid thermal annealing (RTA), laser annealing processes, or other suitable annealing processes. As an example, a high-temperature thermal annealing step that may apply temperatures anywhere in the range of 900 C-1100 C, though other embodiments may use temperatures within a different range. As another example, high-temperature annealing includes thermal processes with temperatures above 600 C. Further, this embodiment may include a "spike" annealing process that has a very short time duration.

Continuing with FIG. 2, an inter-layer dielectric (ILD) 280 is formed on the semiconductor substrate 210 and the dummy gate. A chemical mechanical polishing (CMP) process is performed to remove the ILD 280 such that the dummy gate is exposed. Additionally or alternatively, a hard mask may be formed on top of the dummy gate. The CMP process is applied to expose the hard mask and then an etching process such as a wet etch dip is applied to remove the hard mask, exposing the dummy gate. An etching process is performed to remove the dummy gates in both the NFET and the PFET, forming gate trenches 282 in the NFET and the PFET regions. The dummy gate may be removed by dry etch, wet etch, or a combination of dry and wet etch. For example, a wet etch process may include exposure to a hydroxide containing solution (e.g., ammonium hydroxide), deionized water, and/or other suitable etchant solutions. In some instances, the interfacial layer may also be removed using, e.g., HF wet etching or other suitable process after dummy gate stack is removed to expose the substrate surface.

Figure 3:
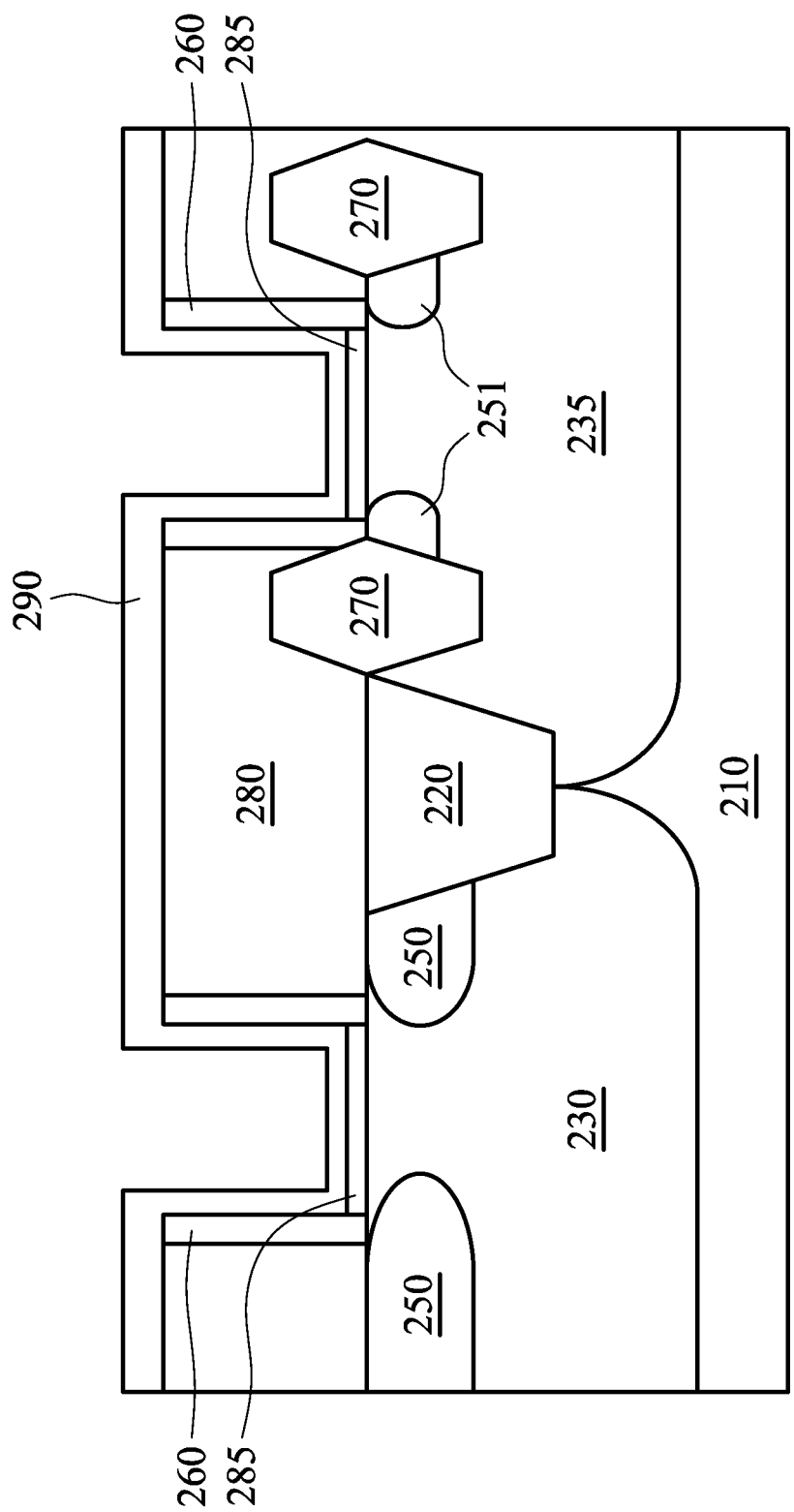

The method 100 proceeds to step 104 by depositing a interfacial layer (IL) 285 and a HK dielectric layer 290 on the gate trenches 282, as shown in FIG. 3. The IL 285 may include a silicon oxide (SiO2) layer (e.g., thermal or chemical oxide formation). Alternatively, the IL 285 may optionally include HfSiO or SiON formed by atomic layer deposition (ALD), chemical vapor deposition (CVD), physical vapor deposition (PVD), thermal oxidation, or combinations thereof. It has been observed that an IL layer may provide a remedy for some HK dielectric gate stack integration issues, such as threshold voltage pinning and reducing carrier mobility. Due to a gate dielectric's influence on the transistor channel and electrical performance is a function of the individual contributions of the various layers, threshold voltages can be controlled by varying the IL thickness for different transistor applications. The IL may be important as diffusion barriers, preventing undesirable interface reactions between HK dielectric material and the substrate. The HK dielectric layer 290 may be formed by ALD, CVD, metalorganic CVD (MOCVD), PVD, thermal oxidation, combinations thereof, or other suitable techniques.

The HK dielectric layer 290 may include a binary or ternary high-k film such as HfOx. Alternatively, the HK dielectric layer 290 may optionally include other HK dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides, or other suitable materials. In the depicted embodiment, the HK layer 290 includes HfO2 and is deposited by ALD. A post HK layer deposition annealing may be performed to enhance moisture control in gate dielectrics.

Figure 4:
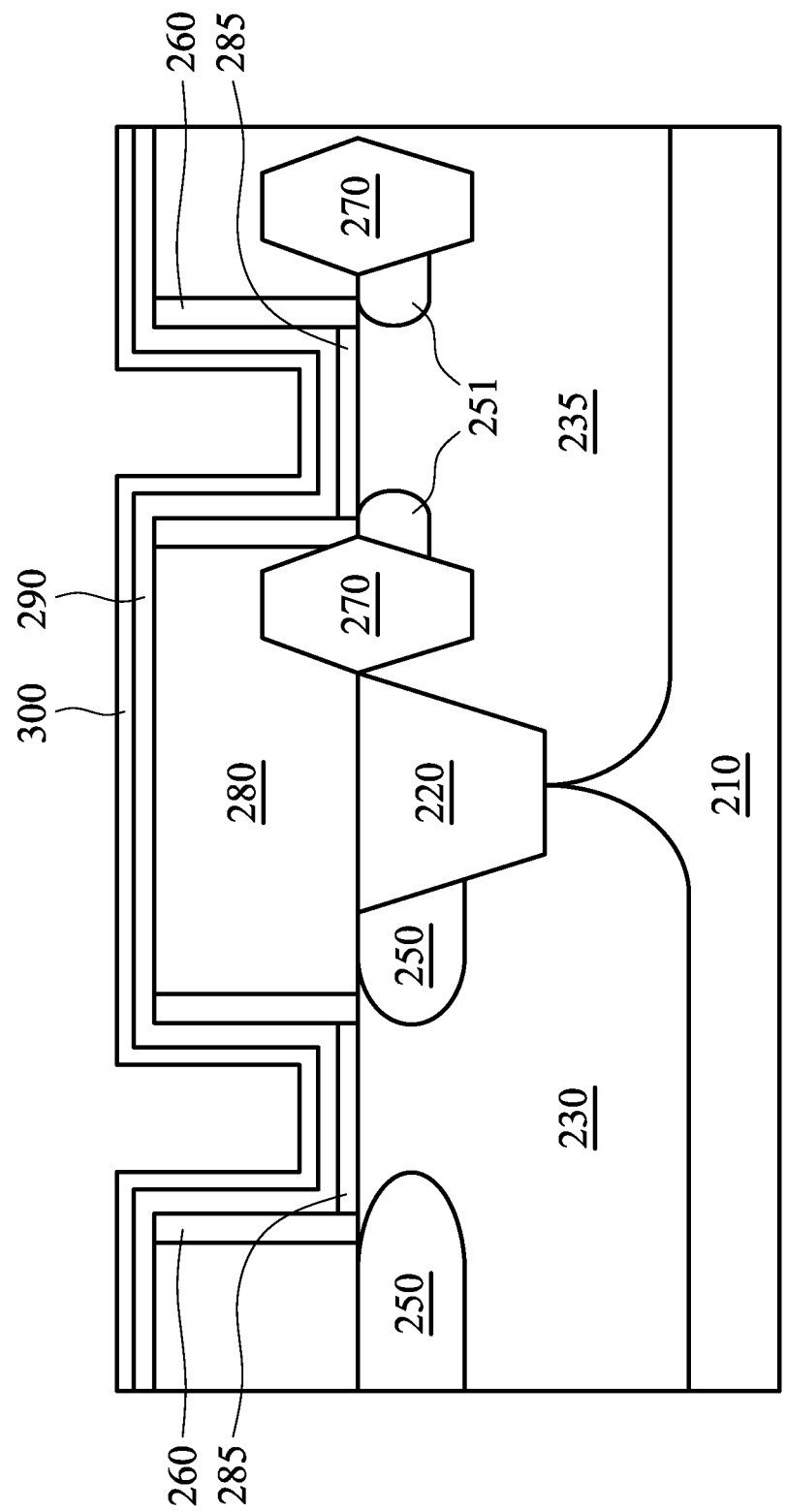

The method 100 proceeds to step 106 by depositing a capping layer 300 over the HK dielectric layer 290, as shown in FIG. 4. The capping layer 300 conducts electricity and prevent inter-diffusion and reaction between HK dielectric layer 290 and a metal gate layer. The candidates for a HK capping layer material may include refractory metals and their nitrides (e.g. TiN, TaN, W2N, TiSiN, TaSiN). A HK capping layer may be deposited by physical vapor deposition (PVD), chemical vapor deposition (CVD), Metal-organic chemical vapor deposition (MOCVD) and atomic layer deposition (ALD). PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film. ALD is a gas phase chemical process and it is a self-limiting atomic layer-by-layer growth method. The surface-controlled growth mechanism of ALD provides good step coverage and dense films with few (or no) pinholes. The precision achieved with ALD allows processing of extremely thin films in a controlled way in the nanometer scale.

When forming a HK capping layer in closer proximity to channel regions of PFET and NFET, film stress (compressive or tensile) of the HK capping layer may induce strain into channels. For example, a tensile stress HK capping layer may induce a compressive strain into a proximity p-channel as well as a compressive HK capping layer may induce a tensile strain into a proximity n-channel. It has been observed that, with a desirable type of channel strain, carrier mobility may enhance as well as device performance. As an example, a compressive strain p-channel may enhance hole mobility and a tensile strain n-channel may enhance electron mobility. Stress type and magnitude of a HK capping layer may be employed by deposition method, deposition condition, and material of the HK capping layer. As an example, an ALD TiN may be formed a HK capping layer with tensile stress. As another example, a PVD TiN may be formed a HK capping layer with compressive or tensile stress, depending on deposition conditions, such as deposition temperature. In the depicted embodiment, the HK capping layer 300 includes a tensile stress ALD TiN. Meanwhile the ALD TiN HK capping layer 300 may serve as a P-work function (P-WF) metal layer for PMOS as well.

It has been demonstrated that PMOS and NMOS respond differently to different types of strain. For example, PMOS performance receives benefit from applying compressive strain to the channel, whereas NMOS receives benefit from tensile strain. Thus by inducing strain locally will allow both n-channel and p-channel strain to be modulated independently.

Figure 5:
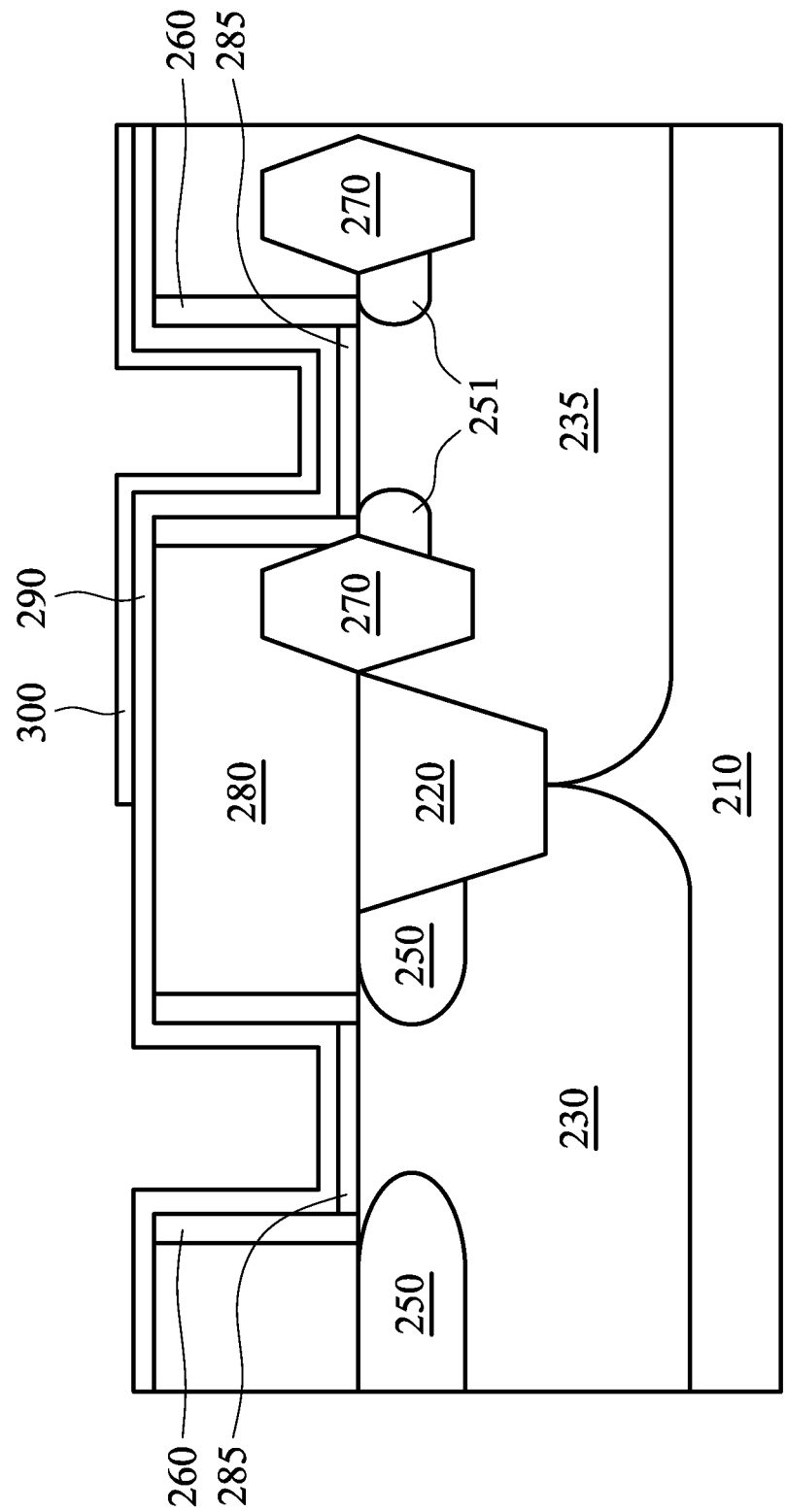

The method 100 proceeds to step 108 by removing a portion of the HK capping layer 300 in NFET region, as shown in FIG. 5. The portion of HK capping layer 300 in NFET may be removed by pattern and etch techniques. The removing technique may include a dry etch, a wet etch and combinations thereof. In the depicted embodiment, removing the tensile stress capping layer 300 from the NMOS portion opens NMOS portion to receive a different stress type capping layer in closer proximity to the n-channel later. Thus n-channel strain may be modulated independently to the p-channel. Also in the depicted embodiment, removing the ALD TiN capping layer 300, a mid-gap WF metal, from the NMOS portion may improve the NMOS threshold voltages (Vt) control.

Figure 6:
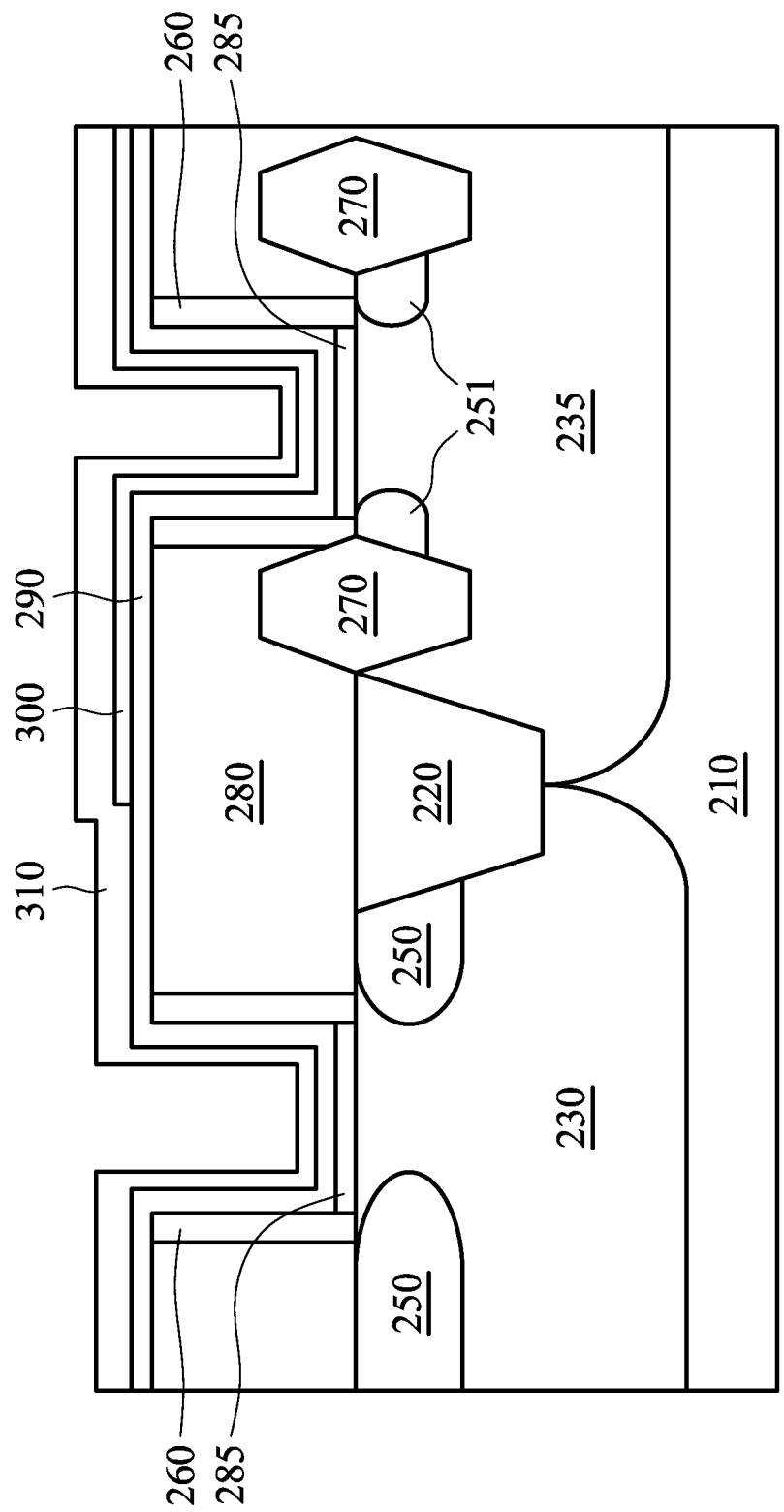

The method 100 proceeds to step 110 by depositing an N work-function (WF) metal layer 310 over both NMOS and PMOS, as shown in FIG. 6. The N-WF metal layer 310 is in closer proximity to the n-channel. Thus a compressive stress N-WF metal layer 310 may induce a tensile strain into the n-channel, which may enhance electron mobility. The N-WF metal layer 310 may include a single metal layer or multi-metal layer structure such as Ti, Mn, Zr, TaN, TiN, TiAl, TiAlN$_{1-x}$, TaC, TaCN, TaSiN, and combinations thereof. The N-WF metal layer 310 may be formed by ALD, PVD, CVD, or other suitable process.

Stress type and stress magnitude of the N-WF metal layer 310 may be employed by deposition method, deposition condition, and material of the N-WF metal layer 310. In the depicted embodiment, the N-WF metal layer 310 includes PVD TiAlN$_{1-x}$ with compressive stress. Additionally or alternatively, in the depicted embodiment, a compressive layer PVD TiN$_{1-x}$ (not shown) may be deposited before the N-WF metal layer 310 as a HK capping layer in the NMOS for device reliability improvement, such as improving positive bias temperature instability (PBTI).

Continuing with FIG. 6, in the depicted embodiment, the WF TiAlN$_{1-x}$ layer 310 is deposited over both NMOS and PMOS. It has been observed that TiAlN$_{1-x}$ shows more thermally stable than TiAl, which may contribute threshold voltages (Vt) stability improvement in both NMOS and PMOS devices. Also the N-WF layer 310 is in closer proximity on top of the HK dielectric layer 290 in the NMOS and may play a function as one of capping layers of HK dielectric layer 290 in the NMOS. By using a thermally stable WF metal layer, such as TiAlN$_{1-x}$, a time-dependent-dielectric-breakdown (TDDB) reliability issue of HK dielectric layer may be improved and threshold voltages (Vt) of NMOS and PMOS may experience more stable as well.

The method 100 proceeds to step 112 by forming a N-metal gate stack 350A (in the NMOS) and a P-metal gate stack 350B (in the PMOS) over the N-WF metal layer 310. The metal gate stacks 350A and 350B may be formed independently or simultaneously. The metal gate stack 350A and 350B may include WF layers such as layers 300 and 310, fill metal layer, liner layer, wetting layer, and adhesion layer. Further, the N-metal gate stack 350A may include a single metal layer or multi-metal layer structure with a sufficiently low EWF value such as Ti, Ag, Al, TiAlN, TaC, TaCN, TaSiN, Mn, Zr, and combinations thereof.

The P-metal gate stack 350B may include a single metal layer or multi-metal layer structure with a sufficiently high effective work function (EWF) value such as TiN, TaN, Ru, Mo, Al, WN, and combinations thereof. The metal gate stacks 350A and 350B may be formed by ALD, PVD, CVD, or other suitable process. As an example, a Ti layer may be deposited to function as a wetting layer for a subsequent Al filling. The Ti layer may be formed by PVD or other suitable process. As another example, a fill metal may include Al and Al layer may be formed by CVD, PVD or other suitable technique. Alternatively, the fill metal layer may include copper (Cu) and tungsten (W).

In the depicted embodiment, the metal gate stacks 350A and 350B may include a wetting layer PVD Ti and a fill metal layer PVD Al. In one embodiment, a barrier layer may be formed under the fill metal Al layer. The barrier layer may include PVD TiN. Diffusion prevention properties of a barrier layer varies with the stoichiometry of the material and the deposition method applied. Diffusion prevention properties impacts the performance of the device. For example, a nitride-rich (a ratio of N to Ti>1) TiN barrier for Al metal layer is more efficient to prevent Al diffusion into the HK dielectric layer, where such diffusion is believed to contribute to a device reliability issue-time-dependent dielectric breakdown (TDDB). A nitride-rich TiN is usually more thermally stable than a Ti-rich TiN with a Ti:N ratio larger than 1:1. Alternatively, in other embodiment, the barrier layers may include any appropriate number of layers of different composition (e.g. three or more). In one embodiment, the metal layers are deposited by using a chemical vapor deposition (CVD) process or other suitable process. By the disclosed method, the metal gate stacks for NMOS and PMOS are formed with different compositions and configurations. The work functions for the NMOS and the PMOS regions are tuned independently.

Continuing with the step 112 of the method 100, in one embodiment, an ALD TaN layer is formed on top of the HK capping layers as an etch-stop-layer (ESL) in a dummy gate structure. It has been observed that the TaN ESL may make NMOS Vt be trended up undesirably. It may be removed after the dummy gate removal for improving NMOS Vt stability.

Figure 7:
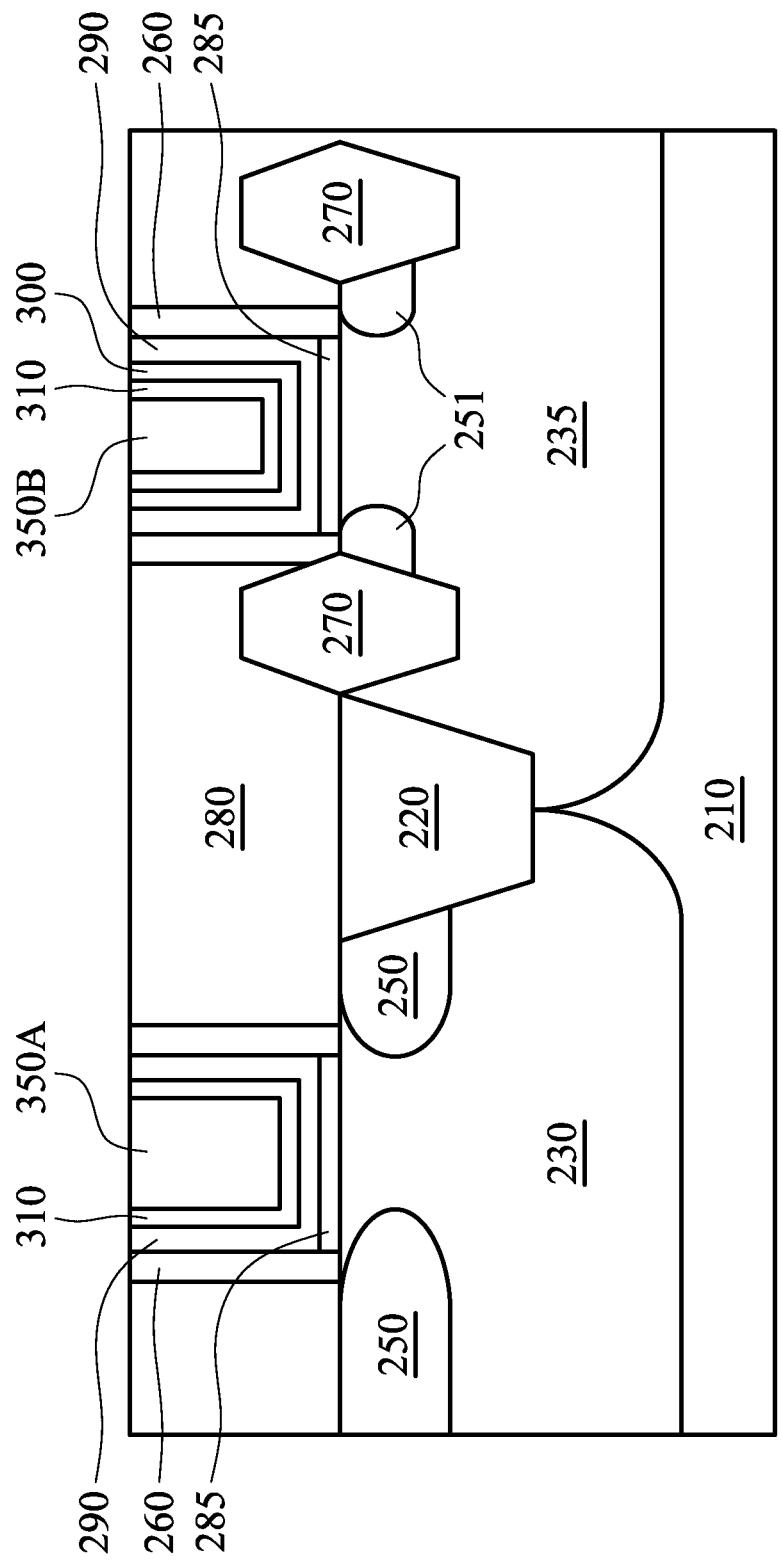

A chemical mechanical polishing (CMP) may be performed on the various metal layers to planarize the NMOS and PMOS devices. The CMP process may have a high selectivity of metal layers to dielectric layer 280. The CMP process to provide a substantially planar surface for the metal gate stacks 350A, 350B and ILD layer 240, as shown in FIG. 7.

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
 a PMOS gate structure including:
  a high-k (HK) dielectric layer formed over the semiconductor substrate;
  a tensile stress HK layer of TiN formed directly on the HK dielectric layer;
  a compressive stress layer; and
  a plurality of metal layers formed on the tensile stress HK layer;
 an NMOS gate structure including:
  the HK dielectric layer formed over the semiconductor substrate;
  the compressive stress layer formed on the HK dielectric layer; and
  a plurality of metal gate layers deposited over the compressive stress layer.
2. The device of claim 1, wherein the tensile stress HK of TiN layer is formed by an ALD technique, and wherein an underlying p-channel is a compressive strained channel.
3. The device of claim 1, wherein the compressive stress layer is TiN layer formed by a PVD technique, and wherein an underlying n-channel is a tensile strained channel.
4. The device of claim 1, wherein the compressive layer comprises a $TiAlN_{1-x}$ layer.

* * * * *